(12) United States Patent
Lee

(10) Patent No.: US 6,222,889 B1
(45) Date of Patent: Apr. 24, 2001

(54) TRELLIS DECODER WITH SOFT DECISION OUTPUTS

(75) Inventor: Kwan Yee Lee, San Francisco, CA (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 09/020,590

(22) Filed: Feb. 4, 1998

(51) Int. Cl.[7] .................................................. H04L 23/02
(52) U.S. Cl. .......................... 375/265; 375/341; 714/792
(58) Field of Search ................................. 375/341, 265; 714/792

(56) References Cited

U.S. PATENT DOCUMENTS

| | | | |
|---|---|---|---|
| 4,933,956 | * 6/1990 | Forney, Jr. | 375/341 |
| 5,414,738 | * 5/1995 | Bienz | 375/341 |
| 5,550,870 | * 8/1996 | Blaker et al. | 375/341 |
| 5,844,946 | * 12/1998 | Nagayasu | 375/341 |

OTHER PUBLICATIONS

Hui–Ling Lou "Implementing the Viterbi Algorithm"; IEEE Signal Processing Magazine Sep. 1995, vol. 12, No. 5.
M. Luise and R. Reggiannini "Performance Evaluation Of An Adaptive GSM Receiver With Frequency–Selective Fading and Adjacent And Co–Channel Interference"; International Journal of Digital and Analog Communication vol. 6, 29–37 (1993).

S.Ono et al. "A MLSE Receiver for the GSM Digital Cellular System" Mobile Communications R&D Department Oki Electric Industry Co., Ltd.

J. Hagenauer and P. Hoeber "A Viterbi Algorithm with Soft–Decision Outputs and its Applications"; German Aerospace Research Establishment, Institute for Communications Technology, Germany; 1989 IEEE.

* cited by examiner

*Primary Examiner*—Don N. Vo
(74) *Attorney, Agent, or Firm*—Fish & Richardson P.C.

(57) ABSTRACT

A trellis decoding system is provided having a memory for storing a sequence of received signals. The signals have been encoded prior to transmission by a trellis encoder such that each of a predetermined plurality of symbols represents an allowed transition from an originating state to a predetermined limited number of terminating states. The system includes a trellis decoder for decoding the sequence of received signals into a corresponding sequence of the symbols. A soft decision generator is provided. The soft decision generator is responsive to the signals stored in the memory and to the output of the trellis decoder and determines a soft decision parameter representative of confidence level of the trellis decoder in properly decoding the received signal into each one of the symbols. The determined soft decision parameter is tagged to each one of such symbols subsequent to the trellis decoder decoding the sequence of received signals into the corresponding sequence of symbols.

1 Claim, 5 Drawing Sheets

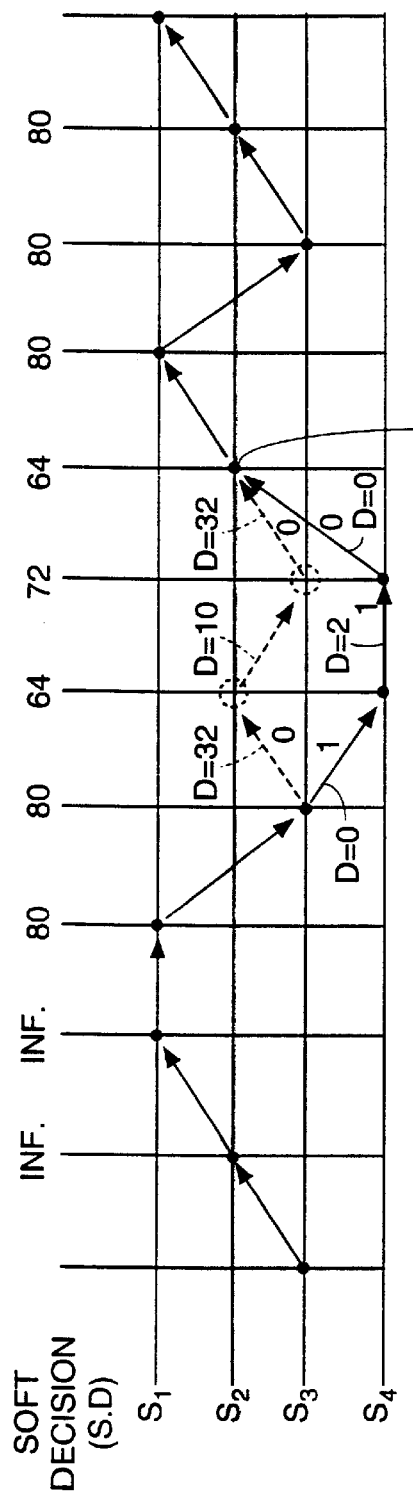

TRELLIS DECODER WITH SOFT DECISION OUTPUTS

BACKGROUND OF THE INVENTION

This invention relates generally to trellis decoders and more particularly to trellis decoders which produce soft decision (SD) outputs.

As is known in the art, trellis decoders are used in receivers of digital communication systems to reduce or eliminate errors caused by noise or distortion in a communication channel through which a sequence of data is transmitted. With such system, a coder is provided at the transmitter to encode the sequence of data into a sequence of symbols, each symbol representing an allowed transition from an originating trellis state of a state machine to a limited number of terminating trellis states. Referring to FIG. 1, the allowed transitions are shown for a state machine adapted to have four trellis states: $S_1$, $S_2$, $S_3$, and $S_4$. The coder encodes the sequence of data into a sequence of symbols; here symbols $A_1$, $A_2$, $A_3$, and $A_4$, such that:

symbol $A_1$, represents an allowed transition from originating state $S_1$ to terminating state $S_1$, as a result of an input X, here 0, and from originating state $S_2$ to terminating state $S_3$ as a result of an input Y, here 1;

symbol $A_2$ represents an allowed transition from originating state $S_3$ to terminating state $S_4$ as a result of an input Y, here 1, and from originating state $S_4$ to terminating state $S_2$ as a result of an input X, here 0;

symbol $A_3$ represents an allowed transition from originating state $S_1$ to terminating state $S_3$ as a result of an input Y, here 1, and from originating state $S_2$ to terminating state $S_1$ as a result of an input X, here 0 and symbol $A_4$ represents an allowed transition from originating state $S_3$ to terminating state $S_2$ as a result of an input X, here 0 and from originating state $S_4$ to terminating state $S_4$ as a result of an input Y, here 1.

It should be noted that the current, (i.e., originating), state and the input value (i.e X or Y) specifies which symbols out of the entire set of symbols, here $A_1$, $A_2$, $A_3$ and $A_4$, may validly appear next in the sequence of transmitted symbols (i.e., the terminating state, or node, N). (For example, originating State $S_1$ specifies that only symbols $A_1$ and $A_3$ may validly appear next in the sequence of symbols to be transmitted.) Thus, only selected sequences of transmitted symbols are permitted by the coding scheme. These permitted sequences are referred to as branches, here in this example, branches $B_1$–$B_8$ in a trellis diagram shown in FIG. 1. Thus, each branch is defined by the originating state, the input value, the terminating state, and the symbol which uniquely represents the transition between such states. Thus, for example, from state $S_1$ with an input value of Y, here 1, the only branch traversed is $B_2$ to terminating state $S_3$, and the only valid symbol which may exist in this transition through branch $B_2$ is the symbol $A_3$. (Note that irrespective of the starting (or initiating) state, two consecutive X inputs (i.e., here two consecutive inputs of 0) will bring the trellis to state $S_1$, as this is a property of the trellis in this example, FIG. 2. Thus, the trellis shown in FIG. 1, having four trellis states $S_1$–$S_4$ has two memory states MS, where $2^{MS}$=the number of trellis states).

Consider, as an example, that the symbols $A_1$, $A_2$, $A_3$, and $A_4$ are represented by values as follows: $A_1$=(+2, +2); $A_2$=(−2, +2); $A_3$=(−2, −2); and $A_4$=(+2, −2). Further, let the following sequence of input values is to be transmitted:

$$\{X, X, X, Y, Y, Y, X, X, Y, X, X\},$$

i.e., here, $$\{0, 0, 0, 1, 1, 1, 0, 0, 1, 0, 0\}.$$

Assuming that we started at the start state $S_3$, then the output from the encoding mapping process will result in the output symbols:

$$\{A_4, A_3, A_1, A_3, A_2, A_4, A_4, A_2, A_3, A_3, A_4, A_3\},$$

i.e., here, $$\{(+2, -2), (-2, -2), (+2, +2), (-2, -2), (-2, +2), (+2, -2), (-2, +2), (-2, -2), (-2, -2), (+2, -2), (-2, -2)\}.$$

However, because noise and/or distortion in the communication channel, let it be assumed that the signals sequentially received at the receiver are:

$$\{(+2, -2), (-2, -2), (+2, +2), (-2, -2), (-2, +2), (+1, -1), (-2, +2), (-2, -2), (-2, -2), (+2, -2), (-2, -2)\}.$$

It is noted that while all the received symbols except one are correct, the sixth symbol, (i.e., the signal (+1, −1)) is not one of the values of the symbols in the set because of channel noise and/or distortion. A trellis decoder at the receiver is used to determine the sixth received "corrupted" symbol.

In order to decode the received sequence, one obvious method is the brute-force method whereby one forms an expected output symbol sequence of $\{A_1, A_2, A_3, A_4\}$ for every possible input sequence values of X and Y, and compares these with the received sequence of $\{A_1, A_2, A_3, A_4\}$. It is obvious that the locally generated sequences which best matches the received sequence for a given criteria is the best estimate of the original input sequence. However, it is clear that the number of possible output sequences grows non-linearly (i.e., by the power of 2) as the number of states and length of the input sequence growths. Thus this brute-force method is not optimal in terms of computational efficiency.

In order to increase the computational efficiency and keeping the optimality criteria, one can adopt a different strategy. The trellis decoder shown in FIG. 4, determines, in this example, a "branch metric" for each of the branches in the trellis. The branch metric is the Euclidian distance, D, between the value of a received signal at a given time and the value represented by a symbol in the set of symbols, i.e., if (a,b) represents one of the valid set of symbols ($A_1, A_2, A_3, A_4$), and (c,d) represents the received symbol, then the Euclidian distance (D) is given by $D=(a-c)^2+(b-d)^2$. Thus, in proceeding from one transition to the next transition, the processes that are required to be performed can be summarized as:

(i) For every starting state SI and corresponding end state $S_E$ compute the Euclidian distance D between the expected transition output symbol and the received symbol where the expected symbols take on the values $\{A_1, A_2, A_3, A_4\}$ as defined. This is carried out by a Branch Metric Calculation (BMC) Generation Unit.

(ii) For every starting state SI and corresponding end state $S_E$ compute the sum of the branch metric (D) calculated in step (i) and the Accumulated Path Metric (APM) memory retained for that particular starting state $S_I$ from the previous transition. This is sum-compare-select function is performed by an Add-Compare-Select (ACS) unit.

(iii) For each end state, retain only the transition which has produced the lowest sum G from all the possible start states to reach the end state $S_E$ and store it back in the Accumulated Path Metric (APM) memory.

(iv) Repeat the procedure (i) to (iii) for every received symbol.

The above decoding procedure is generally known as the Viterbi Algorithm and is applicable for the decoding of any type of coding which follows a pre-determined trellis. The Viterbi algorithm for sequence detection is described in the IEEE Transactions on information Theory, Vol. IT-13, pp. 260–269 (April 1967). Thus all forms of convolutional coding and types channel modelling can use the Viterbi Algorithm for data recovery.

Thus, in this example, and referring also to FIG. 3, one can compute a table of values as given below to decode the received sequence of symbols to give an estimate of the original sequence of inputs. It is assumed that the starting state is $S_3$.

Frame 1: (+2, −2)

| $S_E$ | $S_I$ | Expected symbol | Distance D | Initial APM | Final APM | Keep? |
|---|---|---|---|---|---|---|
| $S_1$ | $S_1$ | $A_1$ (+2, +2) | 16 | inf. | inf. | yes |
| $S_1$ | $S_2$ | $A_3$ (−2, −2) | 16 | inf. | inf. | no |
| $S_2$ | $S_3$ | $A_4$ (+2, −2) | 0 | 0 | 0 | yes |
| $S_2$ | $S_4$ | $A_2$ (−2, +2) | 32 | inf. | inf. | no |
| $S_3$ | $S_1$ | $A_3$ (−2, −2) | 16 | inf. | inf. | yes |
| $S_3$ | $S_2$ | $A_1$ (+2, +2) | 16 | inf. | inf. | no |
| $S_4$ | $S_3$ | $A_2$ (−2, +2) | 32 | 0 | 32 | yes |
| $S_4$ | $S_4$ | $A_4$ (+2, −2) | 0 | inf. | inf. | no |

Frame 2: (−2, −2)

| $S_E$ | $S_I$ | Expected symbol | Distance D | Initial APM | Final APM | Keep? |
|---|---|---|---|---|---|---|
| $S_1$ | $S_1$ | $A_1$ (+2, +2) | 32 | inf. | inf. | no |
| $S_1$ | $S_2$ | $A_3$ (−2, −2) | 0 | 0 | 0 | yes |
| $S_2$ | $S_3$ | $A_4$ (+2, −2) | 16 | inf. | inf. | no |
| $S_2$ | $S_4$ | $A_2$ (−2, +2) | 16 | 32 | 48 | yes |
| $S_3$ | $S_1$ | $A_3$ (−2, −2) | 0 | inf. | inf. | no |
| $S_3$ | $S_2$ | $A_1$ (+2, +2) | 32 | 0 | 32 | yes |
| $S_4$ | $S_3$ | $A_2$ (−2, +2) | 16 | inf. | inf. | no |
| $S_4$ | $S_4$ | $A_4$ (+2, −2) | 16 | 32 | 48 | yes |

Frame 3: (+2, +2)

| $S_E$ | $S_I$ | Expected symbol | Distance D | Initial APM | Final APM | Keep? |
|---|---|---|---|---|---|---|
| $S_3$ | $S_1$ | $A_1$ (+2, +2) | 0 | 0 | 0 | yes |
| $S_1$ | $S_2$ | $A_3$ (−2, −2) | 32 | 48 | 80 | no |
| $S_2$ | $S_3$ | $A_4$ (+2, −2) | 16 | 32 | 48 | yes |
| $S_2$ | $S_4$ | $A_2$ (−2, +2) | 16 | 48 | 64 | no |

Frame 3: (+2, +2) -continued

| $S_E$ | $S_I$ | Expected symbol | Distance D | Initial APM | Final APM | Keep? |
|---|---|---|---|---|---|---|
| $S_3$ | $S_1$ | $A_3$ (−2, −2) | 32 | 0 | 32 | yes |
| $S_3$ | $S_2$ | $A_1$ (+2, +2) | 0 | 48 | 48 | no |
| $S_4$ | $S_3$ | $A_2$ (−2, +2) | 16 | 32 | 48 | yes |
| $S_4$ | $S_4$ | $A_4$ (+2, −2) | 16 | 48 | 64 | no |

Frame 4: (−2, −2)

| $S_E$ | $S_I$ | Expected symbol | Distance D | Initial APM | Final APM | Keep? |
|---|---|---|---|---|---|---|
| $S_1$ | $S_1$ | $A_1$ (+2, +2) | 32 | 0 | 32 | yes |
| $S_1$ | $S_2$ | $A_3$ (−2, −2) | 0 | 48 | 48 | no |
| $S_2$ | $S_3$ | $A_4$ (+2, −2) | 16 | 32 | 48 | yes |
| $S_2$ | $S_4$ | $A_4$ (−2, +2) | 16 | 48 | 64 | no |
| $S_3$ | $S_1$ | $A_3$ (−2, −2) | 0 | 0 | 0 | yes |
| $S_3$ | $S_2$ | $A_1$ (+2, +2) | 32 | 48 | 80 | no |
| $S_4$ | $S_3$ | $A_2$ (−2, +2) | 16 | 32 | 48 | yes |
| $S_4$ | $S_4$ | $A_4$ (+2, −2) | 16 | 48 | 64 | no |

Frame 5: (−2, +2)

| $S_E$ | $S_I$ | Expected symbol | Distance D | Initial APM | Final APM | Keep? |
|---|---|---|---|---|---|---|
| $S_1$ | $S_1$ | $A_1$ (+2, +2) | 16 | 32 | 48 | yes |
| $S_1$ | $S_2$ | $A_3$ (−2, −2) | 16 | 48 | 64 | no |
| $S_2$ | $S_3$ | $A_4$ (+2, −2) | 32 | 0 | 32 | yes |
| $S_2$ | $S_4$ | $A_2$ (−2, +2) | 0 | 48 | 48 | no |
| $S_3$ | $S_1$ | $A_3$ (−2, −2) | 16 | 32 | 48 | yes |
| $S_3$ | $S_2$ | $A_1$ (+2, +2) | 16 | 48 | 64 | no |
| $S_4$ | $S_3$ | $A_2$ (−2, +2) | 0 | 0 | 0 | yes |
| $S_4$ | $S_4$ | $A_4$ (+2, −2) | 32 | 48 | 80 | no |

Frame 6: (+1, −1)

| $S_E$ | $S_I$ | Expected symbol | Distance D | Initial APM | Final APM | Keep? |
|---|---|---|---|---|---|---|
| $S_1$ | $S_1$ | $A_1$ (+2, +2) | 10 | 48 | 58 | no |
| $S_1$ | $S_2$ | $A_3$ (−2, −2) | 10 | 32 | 42 | yes |
| $S_2$ | $S_3$ | $A_4$ (+2, −2) | 2 | 48 | 50 | no |
| $S_2$ | $S_4$ | $A_2$ (−2, +2) | 18 | 0 | 18 | yes |
| $S_3$ | $S_1$ | $A_3$ (−2, −2) | 10 | 48 | 58 | no |
| $S_3$ | $S_2$ | $A_1$ (+2, +2) | 10 | 32 | 42 | yes |
| $S_4$ | $S_3$ | $A_2$ (−2, +2) | 18 | 48 | 66 | no |
| $S_4$ | $S_4$ | $A_4$ (+2, −2) | 2 | 0 | 2 | yes |

Frame 7: (−2, +2)

| $S_E$ | $S_I$ | Expected symbol | Distance D | Initial APM | Final APM | Keep? |
|---|---|---|---|---|---|---|
| $S_1$ | $S_1$ | $A_1$ (+2, +2) | 16 | 42 | 58 | no |
| $S_1$ | $S_2$ | $A_3$ (−2, −2) | 16 | 18 | 34 | yes |
| $S_2$ | $S_3$ | $A_4$ (+2, −2) | 32 | 42 | 74 | no |
| $S_2$ | $S_4$ | $A_2$ (−2, +2) | 0 | 2 | 2 | yes |
| $S_3$ | $S_1$ | $A_3$ (−2, −2) | 16 | 42 | 68 | no |

-continued

Frame 7: (−2, +2)

| $S_E$ | $S_I$ | Expected symbol | Distance D | Initial APM | Final APM | Keep? |
|---|---|---|---|---|---|---|
| $S_3$ | $S_2$ | $A_1$ (+2, +2) | 16 | 18 | 34 | yes |
| $S_4$ | $S_3$ | $A_2$ (−2, +2) | 0 | 42 | 42 | no |
| $S_4$ | $S_4$ | $A_4$ (+2, −2) | 32 | 2 | 34 | yes |

Frame 8: (−2, −2)

| $S_E$ | $S_I$ | Expected symbol | Distance D | Initial APM | Final APM | Keep? |
|---|---|---|---|---|---|---|
| $S_1$ | $S_1$ | $A_1$ (+2, +2) | 32 | 34 | 66 | no |
| $S_1$ | $S_2$ | $A_3$ (−2, −2) | 0 | 2 | 2 | yes |
| $S_2$ | $S_3$ | $A_4$ (+2, −2) | 16 | 34 | 50 | yes |
| $S_2$ | $S_4$ | $A_2$ (−2, +2) | 16 | 34 | 50 | no |
| $S_3$ | $S_1$ | $A_3$ (−2, −2) | 0 | 34 | 34 | yes |
| $S_3$ | $S_2$ | $A_1$ (+2, +2) | 32 | 2 | 34 | no |
| $S_4$ | $S_3$ | $A_2$ (−2, +2) | 16 | 34 | 50 | yes |
| $S_4$ | $S_4$ | $A_4$ (+2, −2) | 16 | 34 | 50 | no |

Frame 9: (−2, −2)

| $S_E$ | $S_I$ | Expected symbol | Distance D | Initial APM | Final APM | Keep? |
|---|---|---|---|---|---|---|
| $S_1$ | $S_1$ | $A_1$ (+2, +2) | 32 | 2 | 34 | yes |
| $S_1$ | $S_2$ | $A_3$ (−2, −2) | 0 | 50 | 50 | no |
| $S_2$ | $S_3$ | $A_4$ (+2, −2) | 16 | 34 | 50 | yes |
| $S_2$ | $S_4$ | $A_2$ (−2, +2) | 16 | 50 | 66 | no |
| $S_3$ | $S_1$ | $A_3$ (−2, −2) | 0 | 2 | 2 | yes |
| $S_3$ | $S_2$ | $A_1$ (+2, +2) | 32 | 50 | 82 | no |
| $S_4$ | $S_3$ | $A_2$ (−2, +2) | 16 | 34 | 50 | yes |
| $S_4$ | $S_4$ | $A_4$ (+2, −2) | 16 | 50 | 66 | no |

Frame 10: (+2, −2)

| $S_E$ | $S_I$ | Expected symbol | Distance D | Initial APM | Final APM | Keep? |
|---|---|---|---|---|---|---|
| $S_1$ | $S_1$ | $A_1$ (+2, +2) | 16 | 34 | 50 | yes |
| $S_1$ | $S_1$ | $A_3$ (−2, −2) | 16 | 50 | 66 | no |
| $S_2$ | $S_3$ | $A_4$ (+2, −2) | 0 | 2 | 2 | yes |
| $S_2$ | $S_4$ | $A_2$ (−2, +2) | 32 | 50 | 32 | no |
| $S_3$ | $S_1$ | $A_3$ (−2, −2) | 16 | 34 | 50 | yes |
| $S_3$ | $S_2$ | $A_1$ (+2, +2) | 16 | 50 | 66 | no |
| $S_4$ | $S_3$ | $A_2$ (−2, +2) | 32 | 2 | 34 | yes |
| $S_4$ | $S_4$ | $A_4$ (+2, −2) | 0 | 50 | 50 | no |

Frame 11: (−2, −2)

| $S_E$ | $S_I$ | Expected symbol | Distance D | Initial APM | Final APM | Keep? |
|---|---|---|---|---|---|---|
| $S_1$ | $S_1$ | $A_1$ (+2, +2) | 32 | 50 | 82 | no |
| $S_1$ | $S_2$ | $A_3$ (−2, −2) | 0 | 2 | 2 | yes |
| $S_2$ | $S_3$ | $A_4$ (+2, −2) | 16 | 50 | 66 | no |
| $S_2$ | $S_4$ | $A_2$ (−2, +2) | 16 | 34 | 50 | yes |
| $S_3$ | $S_1$ | $A_3$ (−2, −2) | 0 | 50 | 50 | no |
| $S_3$ | $S_2$ | $A_1$ (+2, +2) | 32 | 2 | 34 | yes |
| $S_4$ | $S_3$ | $A_2$ (−2, +2) | 16 | 50 | 66 | no |
| $S_4$ | $S_4$ | $A_4$ (+2, −2) | 16 | 34 | 50 | yes |

The path metric is the sum of the branch metrics in a path through the trellis. To determine the sequence of symbols, the one of all possible paths through the trellis having the minimum path metric is selected. In the example given above for final Frame 11, the path ending at state $S_1$ has the minimum final path metric, here a final APM of 2. Thus, tracing backwards through where this came from gives the following:

| Frame | 1 | 2 | 3 | 4 | 5 | 6 | 7 | 8 | 9 | 10 | 11 | 12 |
|---|---|---|---|---|---|---|---|---|---|---|---|---|
| State | $S_3$ | $S_2$ | $S_1$ | $S_1$ | $S_3$ | $S_4$ | $S_4$ | $S_2$ | $S_1$ | $S_3$ | $S_2$ | $S_1$ |
| Symbol | $A_4$ | $A_3$ | $A_1$ | $A_3$ | $A_2$ | $A_4$ | $A_2$ | $A_3$ | $A_3$ | $A_4$ | $A_3$ | |
| Est. input | X = 0 | X = 0 | X = 0 | Y = 1 | Y−1 | Y = 1 | X = 0 | X = 0 | Y = 1 | X = 0 | X = 0 | |

As can be seen from above, the recovered input sequence is the exactly the same as the original sequence even though there was an non-ideal symbol received at Frame 6.

The Viterbi algorithm is basically a method which removes branches that cannot possibly constitute the most likely path through the trellis. Thus, for each terminating state in the trellis, the Viterbi algorithm stores the most likely originating state of the branches terminating in the terminating state.

As is also known in the art, in some applications it is desirable to supply to subsequent processors, not only the decoder symbols, but tagged with each decoded symbol, a soft decision parameter (SD) which represents the absolute magnitude between the correct path accumulated path metric and the discarded path metric. A block diagram of the trellis decoder is shown in FIG. 4. The operation of such decoder is described in an article entitled "A Viterbi algorithm with soft decision outputs and its application", by J. Hagenauer, et. al. Proceedings of GLOGECOM-89, No. 47.1, pp. 1680–1686, 1989. and another article entitled "A MLSEE receiver for GSM digital cellular systems", by S. Ono et al., Proceeding of VTC-1994, pp. 230–233, 1994.

In summary, these systems operate by computing and storing the most probable paths through the trellis. More particularly, for the example as in FIG. 1, an Accumulated Path Metric (APM) memory has eight memory locations, one memory location in the Accumulated Path Metric (APM) memory for each one of the eight transitions. As noted above, the branch metrics are initialized to a large value (infinity) except for the pre-define start state which is initialized to a small value (zero). Thus, the Accumulated Path Metric (APM) memory stores for the initial state in the example above: inf., inf., 0, inf., inf., inf., 0, inf. , where "inf." is infinity, for states APM(1–8), respectively, as indicated in the Table above for "Frame 1: (+2, −2)". The data stored in the eight memory locations of the Accumulated Path Metric (APM) memory at the end of each Frame is shown in the Table below:

| Frame | APM Location 1 $S_I = S_1$ $S_E = S_1$ | APM Location 2 $S_I = S_2$ $S_E = S_2$ | APM Location 3 $S_I = S_3$ $S_E = S_3$ | APM Location 4 $S_I = S_4$ $S_E = S_4$ | APM Location 5 $S_I = S_1$ $S_E = S_1$ | APM Location 6 $S_I = S_2$ $S_E = S_2$ | APM Location 7 $S_I = S_3$ $S_E = S_3$ | APM Location 8 $S_I = S_4$ $S_E = S_4$ |
|---|---|---|---|---|---|---|---|---|
| 1 | inf. | inf. | 0 | inf. | inf. | inf. | 32 | inf. |
| 2 | inf. | 0 | inf. | 48 | inf. | 32 | inf. | 48 |
| 3 | 0 | 80 | 48 | 64 | 32 | 48 | 48 | 64 |
| 4 | 32 | 48 | 48 | 64 | 0 | 80 | 48 | 64 |
| 5 | 48 | 64 | 32 | 48 | 48 | 64 | 0 | 80 |
| 6 | 58 | 42 | 50 | 18 | 58 | 42 | 66 | 2 |
| 7 | 58 | 34 | 74 | 2 | 68 | 34 | 42 | 34 |
| 8 | 66 | 2 | 50 | 50 | 34 | 34 | 50 | 50 |
| 9 | 34 | 50 | 50 | 66 | 2 | 82 | 50 | 66 |
| 10 | 50 | 66 | 2 | 82 | 50 | 66 | 34 | 50 |
| 11 | 82 | 2 | 66 | 50 | 50 | 34 | 66 | 50 |

The Branch Metric Calculation (BMC) Generation Unit computes the branch metrics for the first received signal, here (+2, −2). Thus, the Branch Metric Calculation (BMC) Generation Unit computes Branch Metrics (D): $D_1$ through $D_8$ as: 16, 16, 0, 32, 16, 16, 32, and 0 respectfully, as indicated in the Table above for "Frame 1: (+2, −2)". An Add-Compare-Select (ACS) unit selects, as described above, the most likely branch to each of the four terminating states, by forming the sum of the Branch Metric Calculation (BMC) Generation Unit output and the previous Accumulated Path Metric (APM) memory values. Thus,

| Start State | $S_1$ | $S_2$ | $S_3$ | $S_4$ | $S_1$ | $S_2$ | $S_3$ | $S_4$ |
|---|---|---|---|---|---|---|---|---|
| End State | $S_1$ | $S_1$ | $S_2$ | $S_2$ | $S_3$ | $S_3$ | $S_4$ | $S_4$ |
| BMC (D) | 16 | 16 | 0 | 32 | 16 | 16 | 32 | 0 |
| Old APM | inf. | inf. | 0 | inf. | inf. | inf. | 0 | inf. |
| New APM | inf. | inf. | 0 | inf. | inf. | inf. | 32 | inf. |
| Retained | inf. | | 0 | | inf. | | 32 | |

-continued

| APM (Ending State, $S_I$) | $(S_1)$ | $(S_2)$ | $(S_3)$ | $(S_4)$ |
|---|---|---|---|---|

The process repeats for the next received signal, here (−2, −2) and so on. Thus, we can see that from going from one Frame to the next we need to store the decisions made at each end state, and called this the trellis store (TS) and is summarized in the Table below:

| Frame | Retained $S_E$ | Retained $S_I$ | Retained APM |
|---|---|---|---|
| 1 | $S_1$ | $S_1$ | inf. |
|   | $S_2$ | $S_3$ | 0 |
|   | $S_3$ | $S_1$ | inf. |
|   | $S_4$ | $S_3$ | 32 |
| 2 | $S_1$ | $S_2$ | 0 |
|   | $S_2$ | $S_4$ | 48 |
|   | $S_3$ | $S_2$ | 32 |
|   | $S_4$ | $S_4$ | 48 |
| 3 | $S_1$ | $S_1$ | 0 |

-continued

| Frame | Retained $S_E$ | Retained $S_I$ | Retained APM |
|---|---|---|---|
|   | $S_2$ | $S_3$ | 48 |
|   | $S_3$ | $S_1$ | 32 |
|   | $S_4$ | $S_3$ | 48 |
| 4 | $S_1$ | $S_1$ | 32 |
|   | $S_2$ | $S_3$ | 48 |
|   | $S_3$ | $S_1$ | 0 |
|   | $S_4$ | $S_3$ | 48 |
| 5 | $S_1$ | $S_1$ | 48 |
|   | $S_2$ | $S_3$ | 32 |
|   | $S_3$ | $S_1$ | 48 |
|   | $S_4$ | $S_3$ | 0 |
| 6 | $S_1$ | $S_2$ | 42 |
|   | $S_2$ | $S_4$ | 18 |
|   | $S_3$ | $S_2$ | 42 |
|   | $S_4$ | $S_4$ | 2 |
| 7 | $S_1$ | $S_2$ | 34 |
|   | $S_2$ | $S_4$ | 2 |
|   | $S_3$ | $S_2$ | 34 |
|   | $S_4$ | $S_4$ | 34 |

-continued

| Frame | Retained $S_E$ | Retained $S_I$ | Retained APM |
|---|---|---|---|
| 8 | $S_1$ | $S_2$ | 2 |
|  | $S_2$ | $S_3$ | 50 |
|  | $S_3$ | $S_1$ | 34 |
|  | $S_4$ | $S_3$ | 50 |
| 9 | $S_1$ | $S_1$ | 34 |
|  | $S_2$ | $S_3$ | 50 |
|  | $S_3$ | $S_1$ | 2 |
|  | $S_4$ | $S_3$ | 50 |
| 10 | $S_1$ | $S_1$ | 50 |
|  | $S_2$ | $S_3$ | 2 |
|  | $S_3$ | $S_1$ | 50 |
|  | $S_4$ | $S_3$ | 34 |
| 11 | $S_1$ | $S_2$ | 2 |
|  | $S_2$ | $S_4$ | 50 |
|  | $S_3$ | $S_2$ | 34 |
|  | $S_4$ | $S_4$ | 50 |

A Trace Back Unit (TBU) determines from the data stored in the above TS Table the final the most likely path sequentially through the trellis; here, proceeding the ending state $S_E$ of Frame 11 back to initial state $S_1$, of Frame 1: Frame 11, $S_E=S_1$, $S_I=S_2$ (Final APM=2); Frame 10, $S_E=S_2$, $S_I=S_3$ (Final APM=2) ; Frame 9, $S_E=S_1$ $S_I=S_1$ (Final APM=2); Frame 8, $S_E=S_1$, $S_I=S_2$ (Final APM=2); Frame 7, $S_E=S_2$, $S_I=S_4$ (Final APM=2); Frame 6, $S_E=S_4$, $S_I=S_4$ (Final APM=2); Frame 5, $S_E=S_4$, $S_I=S_3$ (Final APM=0); Frame 4, $S_E=S_3$, $S_I=S_1$ (Final APM=0); Frame 3, $S_E=S_1$, $S_I=S_1$ (Final APM=0); Frame 2, $S_E=S_1$, $S_I=S_2$ (Final APM=0); Frame 1, $S_E=S_2$, $S_I=S_3$ (Final APM=0). Therefore, from the initial state $S_3$ of Frame 1 sequentially to ending state $S_1$ of Frame 11, the path is from $S_3$ to $S_2$ to $S_1$ to $S_1$ to $S_3$ to $S_4$ to $S_4$ to $S_2$ to $S_1$ to $S_3$ to $S_2$ to $S_1$. The path is indicated by the heavy (i.e., bold) arrows in FIG. 3. Thus, the Trace Back Unit (TBU) is able to determine that the received signals were {0, 0, 0, 1, 1, 1, 0, 0, 1, 0, 0}.

In addition to the decisions in the Trace Back Unit (TBU), the SD at each of the terminating states is determined and stored in the Soft Decision Generation Unit. As noted above, a soft decision parameter (SD) which represents the absolute magnitude between the correct path accumulated path metric and the discarded path metric. Thus, after receipt of the first symbols, and referring to the Table above for "Frame 1: (+2, −2)", the following set of soft decision data are stored in the terminating states (i.e., ending states $S_E$), $S_1$-$S_1$, respectively: {inf.−inf.=0, inf.−0=inf., inf.−inf=0, inf.−32 =inf.}; for the second received symbol, and referring to the Table above for "Frame 2: (−2, −2)", the following set of soft decision data are stored in the terminating states (i.e., ending states $S_E$), $S_1$-$S_4$, respectively: (inf.−0 =inf., inf.−48 =inf., inf.−32=inf., inf.−48=inf.}; for the third received symbol, and referring to the Table above for "Frame 3: (+2, +2)", the following set of soft decision data are stored in the terminating states (i.e., ending states $S_E$), $S_1$-$S_4$, respectively: {80−0=80, 64−48=24, 48−32=16, 64−48=16}, etc. For the last symbol received, and referring to the Table above for "Frame 11: (−2, −2)", the following set of soft decision data are stored in the terminating states (i.e., ending states $S_E$), $S_1$-$S_4$, respectively: {82−2=80, 66−50=16, 50−34=16, 66−50=16}. The SD data is tagged with the detected symbol in the Trace Back Unit for subsequent processing. It is noted that the larger the soft decision data the greater the confidence level of the decision made by the Viterbi algorithm. From the above the final ending state with the greatest confidence is an ending state $S_E$ of $S_1$. As noted above, a soft decision parameter (SD) which represents the absolute magnitude between the correct path accumulated path metric and the discarded path metric The Soft Decisions (SD), summarized in the Table below, are stored in the Soft Decision (SD) Generation Unit (FIG. 4):

| Frame | Soft Decision Ending State $S_1$ | Soft Decision Ending State $S_2$ | Soft Decision Ending State S3 | Soft Decision Ending State S4 |
|---|---|---|---|---|
| 1 | 0 | inf. | 0 | inf. |
| 2 | inf. | inf. | inf. | inf. |
| 3 | 80 | 16 | 16 | 16 |
| 4 | 16 | 16 | 80 | 16 |
| 5 | 16 | 48 | 16 | 80 |
| 6 | 16 | 32 | 16 | 64 |
| 7 | 24 | 72 | 34 | 8 |
| 8 | 64 | 0 | 0 | 0 |
| 9 | 16 | 16 | 80 | 16 |
| 10 | 16 | 80 | 16 | 16 |
| 11 | 80 | 16 | 16 | 16 |

From the above, the Soft Decision (SD) associated with the signals:

$$\{0, 0, 0, 1, 1, 1, 0, 0, 1, 0, 0\}$$

produced by the Trace Back Unit (TBU) are:

{inf., inf., 80, 80, 80, 64, 72, 64, 80, 80, 80}, respectively. Thus, output of the Trace Back Unit (TBU) may be here represented as: [signal, SD], here:

{[0, inf.]; [0, inf.]; [0, 80]; [1, 80]; [1, 80]; [1, 64]; [0, 72]; [0, 64]; [1, 80]; [0, 80]; [0, 80]}.

It is noted that the 11 signals have be interpreted correctly event though the sixth symbol was corrupted. It is also noted that the soft decision (SD) for the sixth signal is 64.

Thus, in summary, three pieces of information are stored for each time interval (i.e., batch of data, here a batch of 11 signal) and each state in the trellis. These are: (1) the accumulated path metrics (APM), here eight bits of data, for each state which are overwritten each time interval; (2) the most probable signal which led to the state; and (3) the confidence measure, or soft decision (SD) of the stored signal at each one of the ending states $S_E$ or nodes (N; here the computation and storage of 44 soft decisions. In order to perform trace back, only the first two pieces of information are needed. The SD is optional, but its inclusion is often justified as it can add significant improvement to overall system performance.

For long trellis, the computation and memory required for the Add-Compare-Select (ACS) unit is not insubstantial. Further, soft decisions are computed and stored for each one of the ending states SE, or nodes, N, for each one of the Frames. For this reason, the system is known to be a very resource demanding part of the system. In GSM, for example, it is the most computational intensive module after the speech compression module.

SUMMARY OF THE INVENTION

In accordance with one feature of the invention, a trellis decoding system is provided having a memory for storing a sequence of received signals. The signals have been encoded prior to transmission by a trellis encoder such that each of a predetermined plurality of symbols represents an allowed transition from an originating state to a predetermined limited number of terminating states. The system includes a trellis decoder for decoding the sequence of received signals into a corresponding sequence of the symbols. A soft decision generator is provided. The soft decision generator is responsive to the signals stored in the memory and to the output of the trellis decoder and determines a soft decision parameter representative of confidence level of the trellis decoder in properly decoding the received signal into each one of the symbols. The determined soft decision parameter is tagged to each one of such symbols subsequent to the trellis decoder decoding the sequence of received signals into the corresponding sequence of symbols.

With such an arrangement, the soft decisions are computed in the soft decision generator and tagged to the determined symbol without a requirement that they be computed, stored and then tagged to the symbols. Thus, by removing the requirement to compute and store the soft decisions, the decoder system can be considerably simplified.

The computation of the soft decisions is approximated reasonably by having made the following observations: (i) the branches (i.e., paths) that has led to the terminating state (i.e., node, N) originated from the same past time instant node and will end up at a known future time instant node; and (ii) the distance between the originating node to the terminating node is comparable to that of the duration memory of the channel. Therefore, from the foregoing, and realizing that the inter-symbol interference (ISI) can be completely determined given knowledge of the past and future symbols and the channel state, then one can estimate what the difference is between the desired survivor trellis and the discarded trellis. In the limit, if there is no error in the detected symbols, the estimated should be exactly the same as the true soft decision. The true soft decision, SD, is, in general, given by:

$$SD(N)=|(\text{correctpathAPM})-(\text{discardedpathAPM})|$$

where APM is the accumulated path metric.

It is noted that this equation is computed only once per decoded symbol whereas with the prior art system described above in the Background of the Invention section, the soft decision is computed and stored for every possible ending state $S_E$, or node for each Frame.

Thus, in summary, having recognized that a trellis decoder with Viterbi algorithm may be implemented in combinations of hardware and software, computational complexity of such decoder is reduced by having the soft decision generation performed subsequently to the symbol decoding performed by the trellis decoder.

BRIEF DESCRIPTION OF THE DRAWINGS

These and other features of the invention will become more readily apparent from the following detailed description taken together with the accompanying drawings, in which:

FIG. 6 is a diagram showing exemplary signals received by the trellis coding system of FIG. 5.

FIG. 7 is a diagram showing the output of a Trace Back Unit (TBU) used in the system of FIG. 5 in response to the exemplary signals received by the trellis coding system of FIG. 6.

FIG. 8 is a trellis diagram useful in understanding the trellis decoding system of FIG. 5 responding to the sequence of exemplary signals in FIG. 6.

DESCRIPTION OF THE PREFERRED EMBODIMENTS

Figure 5:
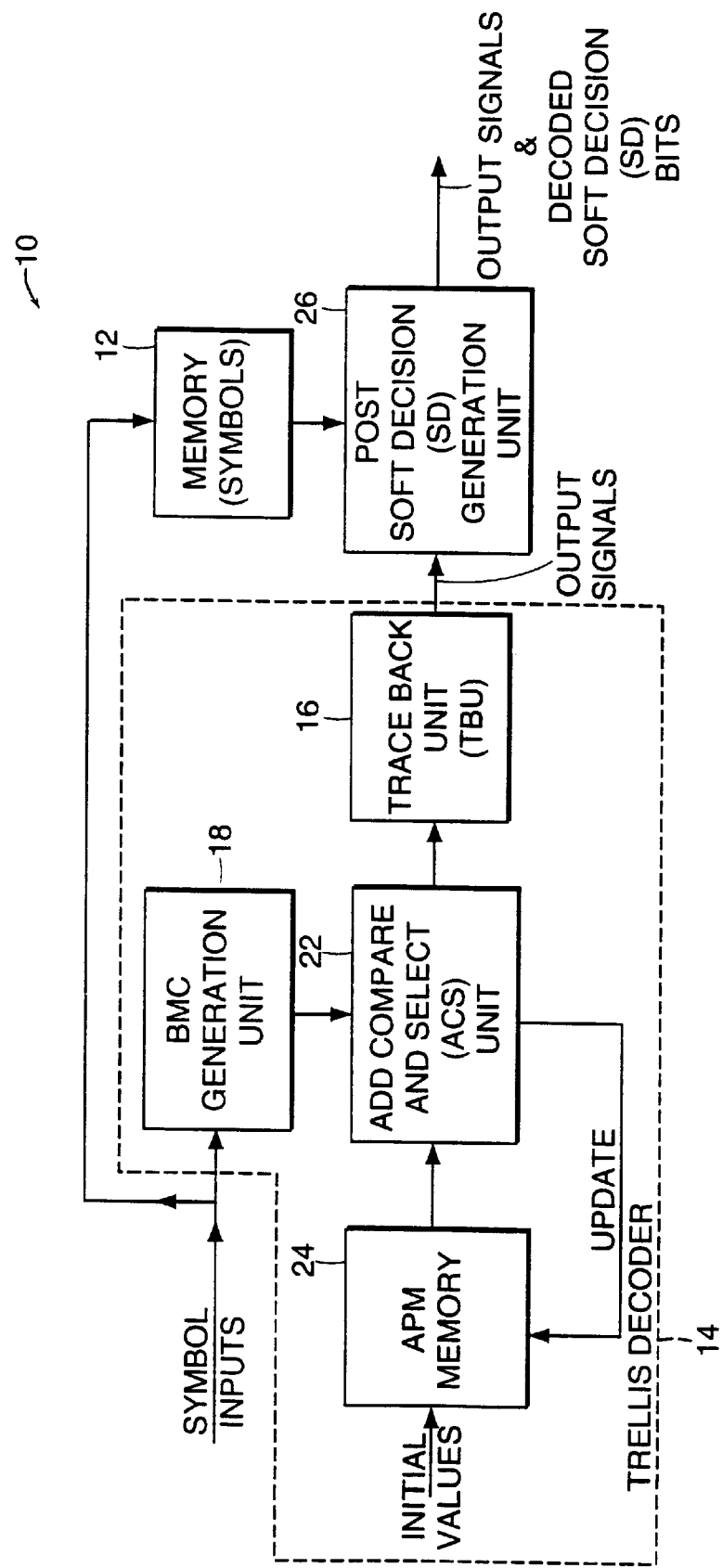
FIG. 5 is a block diagram of a trellis decoding system according to the invention.

Referring now to FIG. 5, a trellis decoding system is shown having a memory 12 for storing a sequence of received signals, as indicated in FIG. 6. Thus, here the received signals are, in this example, the same signal used in the example described above: i.e., the symbols $A_1$, $A_2$, $A_3$, and $A_4$ are represented by values as follows: $A_1=(+2, +2)$; $A_2=(-2, +2)$; $A_3=(-2, -2)$; and $A_4=(+2, -2)$. Further, the sequence of input values is to be transmitted is, in this example:

$$\{X, X, X, Y, Y, Y, X, X, Y, X, X\},$$

i.e., here, $$\{0, 0, 0, 1, 1, 1, 0, 0, 1, 0, 0\}.$$

Again it is assumed that we started at the start state $S_3$, then the output from the encoding mapping process will result in the output symbols:

$$\{A_4, A_3, A_1, A_3, A_2, A_4, A_4, A_2, A_3, A_3, A_4, A_3\},$$

i.e., here, $$\{(+2, -2), (-2, -2), (+2, +2), (-2, -2), (-2, +2), (+2, -2), (-2, +2), (-2, -2), (-2, -2), (+2, -2), (-2, -2)\}.$$

However, because noise and/or distortion in the communication channel, it is again assumed that the signals sequentially received at the receiver are:

$$\{(+2, -2), (-2, -2), (+2, +2), (-2, -2), (-2, +2), (+1, -1), (-2, +2), (-2, -2), (-2, -2), (+2, -2), (-2, -2)\}.$$

Figure 1:
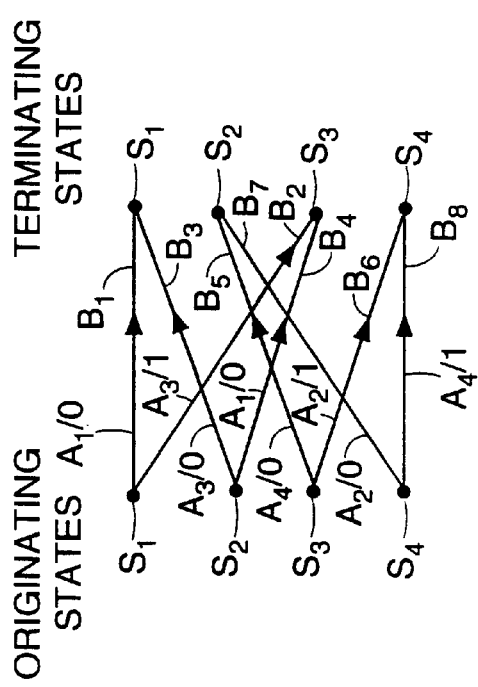
FIG. 1 is an example of a trellis diagram useful in understanding the invention.

It is noted that while all the received symbols except one are correct, the sixth symbol, (i.e., the signal (+1, −1)) is not one of the values of the symbols in the set because of channel noise and/or distortion. The trellis decoder 10 at the receiver is used to determine the sixth received "corrupted" symbol. Thus, the signals have been encoded prior to transmission by a trellis encoder, not shown, such that each of a predetermined plurality of symbols represents an allowed transition from an originating state to a predetermined limited number of terminating states. Here, as noted, the trellis encoder provides encoding in accordance with the trellis diagram in FIG. 1.

Figure 3:
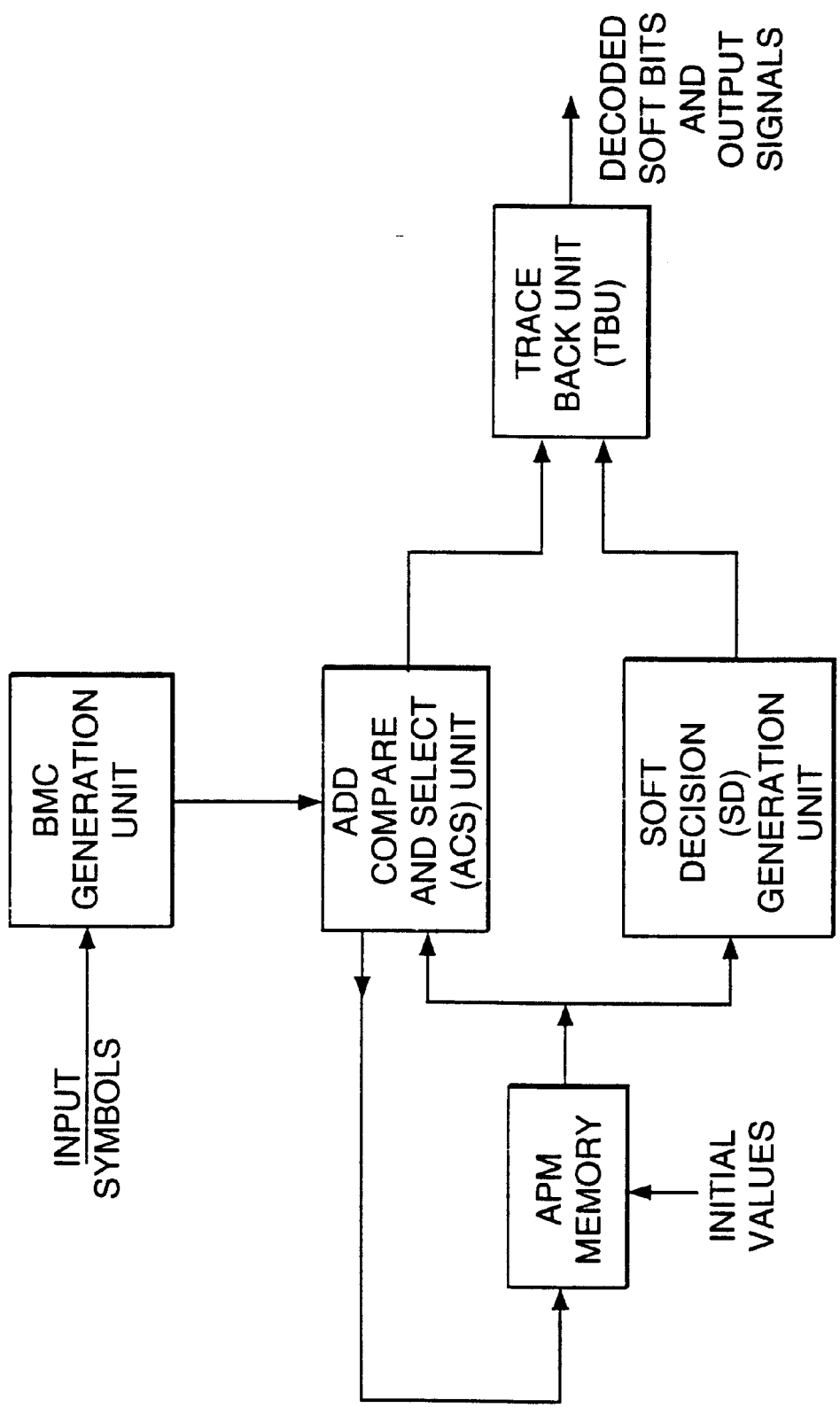
FIG. 3 is a block diagram of a trellis decoding system according to the PRIOR ART.
Figure 4:
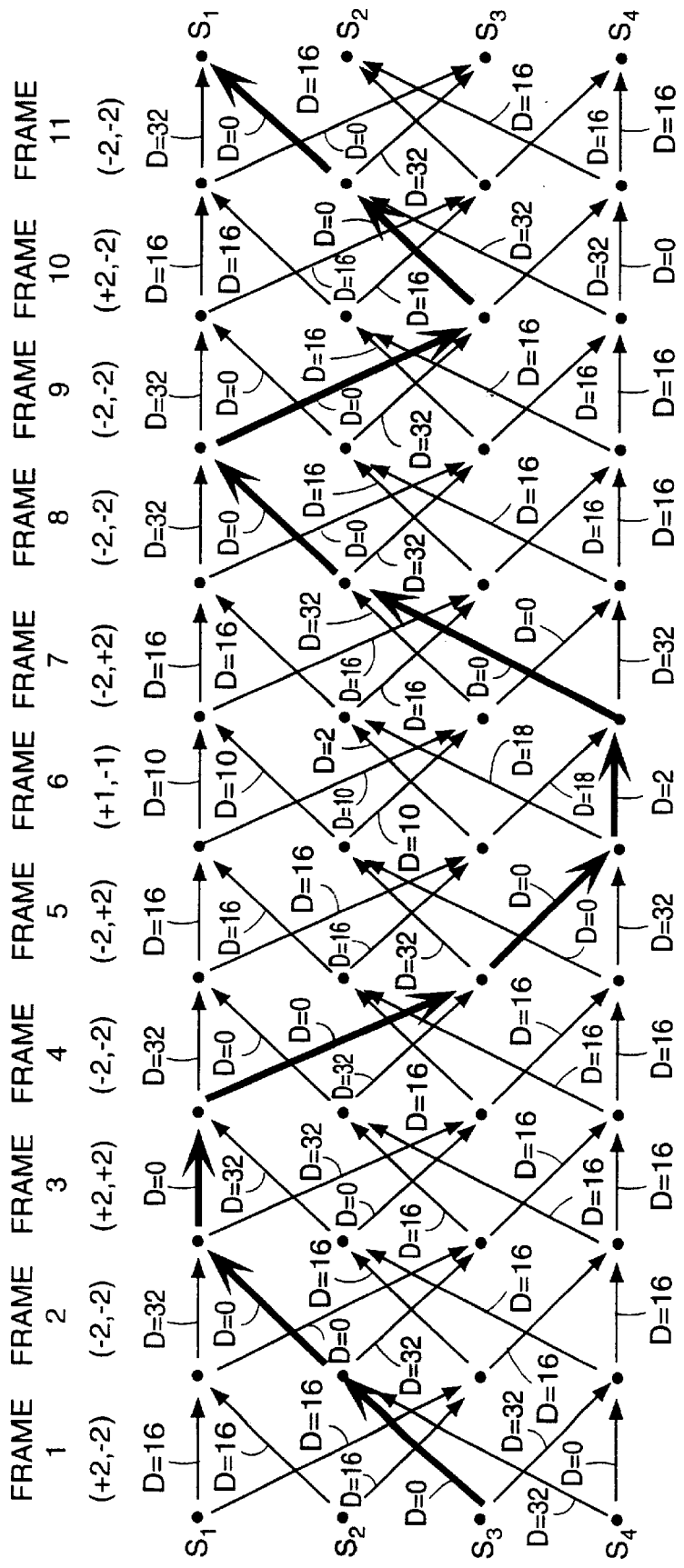
FIG. 4 is an example of a trellis diagram useful in understanding the invention.

The system 10 includes a trellis decoder 14 for decoding the sequence of received signals into a corresponding sequence of the symbols. The trellis decoder 14 includes a Trace Back Unit (TBU) 16, a Branch Metric Calculation (BMC) Generation Unit (BMC) 18 an Add-Compare-Select (ACS) 22 and an Accumulated Path Metric (APM) memory 24, arranged as shown. Thus, the Trace Back Unit (TBU) 16, Branch Metric Calculation (BMC) Generation Unit (BMC) 18, Add-Compare-Select (ACS) 22, and Accumulated Path Metric (APM) memory 24 operate as described above to enable the Trace Back Unit (TBU) 16 to produce the output signals as described above in connection with FIG. 3, Here, however, a soft decision (SD) generator 26 unit (i.e., a Post Soft Decision (SD) Generation Unit 26) is provided at the output of the Trace Back Unit (TBU) 16. The Post Soft Decision (SD) Generation Unit 26 is responsive to: (1) the received symbols (here, in the example above, $\{A_4, A_3, A_1, A_3, A_2, A_4, A_4, A_2, A_3, A_3, A_4, A_3\}$, i.e., $\{(+2, -2), (-2, -2), (+2, +2), (-2, -2), (-2, +2), (+2, -2), (-2, +2), (-2, -2), (-2, -2), (+2, -2), (-2, -2)\}$ which are stored in the memory 12; and (2) the output of the trellis decoder 14. In response thereto, the Post Soft Decision (SD) Generation Unit 26 determines a soft decision (SD) parameter representative of confidence level of the trellis decoder 14 in properly decoding the received signal into each one of the symbols. That is, as noted above, a soft decision parameter (SD) represents the absolute magnitude between the correct path accumulated path metric and the discarded path metric. The determined soft decision parameter (SD) is tagged to each one of such signals subsequent to the trellis decoder 14 decoding the sequence of received signals into the corresponding sequence of signals.

In operation, and considering the example described above in connection with FIG. 2, as noted above, the Trace Back Unit (TBU) 16 of the decoder system 10 produces, for this example, the following sequence of the following signals: 0, 0, 0, 1, 1, 1, 0, 0, 1, 0, 0, as indicated in FIG. 7. The path for such sequence of signals, for the trellis used in this example (FIG. 1) is shown by the solid arrows in FIG. 8. The Post Soft Decision (SD) Generation Unit 26 appends to each signal produced by the Trace Back Unit (TBU) 16 (FIG. 7), a soft decision (SD) parameter by using, in this example, only six branch metrics. For example, considering Frame 7, it is first noted that the trellis used in this example (FIG. 1) has two memory states, MS, where $2^{MS}$=the number of trellis states, here there are four trellis states, $S_1$–$S_4$. Thus, with the trellis in FIG. 1, there are four states $S_1$–$S_4$, resulting in an MS of 2. Thus, from the trellis diagram in FIG. 8, it is known that the proper state at Frame 4 (i.e., the Frame of interest, i.e., Frame 7 minus (MS+1), here 3=Frame 4) is state $S_3$. Thus, the soft decision (SD) unit 16 assumes the APM at State $S_3$ of Frame 4 to be 0 and determines the difference between: the APM from such State $S_3$ at Frame 4 assuming a correct sequence (i.e., 1, 1, 0); and, the APM from such State $S_3$ at Frame 4 assuming an incorrect signal sequence (i.e., 0, 1, 0), indicated by the dotted arrows in FIG. 8. (That is, as noted above, a soft decision parameter (SD) represents the absolute magnitude between the correct path accumulated path metric and the discarded path metric.) Thus, here the branch metrics from State $S_3$, Frame 4 to State $S_2$, Frame 5, to State $S_3$, Frame 6, to State $S_2$, Frame 7 is from the Tables above for "Frame 5: (−2, +2)"; "Frame 6: (+1, −1)"; "Frame 7: (−2, 12) is 32+10+32=74 for an incorrect signal sequence (i.e., 0, 1, 0), indicated by the dotted arrows in FIG. 8. The branch metrics from State $S_3$, Frame 4 to State $S_4$, Frame 5, to State $S_4$, Frame 6, to State $S_2$, Frame 7 is from the Tables above for "Frame 5: (−2, +2)"; "Frame 6: (+1, −1)"; "Frame 7: (−2, 12) is 0+2+0=2 for a correct signal sequence (i.e., 1, 1, 0), indicated by the solid arrows in FIG. 8. Thus, the soft decision determined by the Post Soft Decision (SD) Generation Unit 26 is 74−2=72. This soft decision parameter 72 is tagged with the seventh signal in the sequence, here 0.

It is noted that with the system 10 (FIG. 5), the memory 12 stores the received symbols, here:

$$\{(+2, -2), (-2, -2), (+2, +2), (-2, -2), (-2, +2), (+2, -2), (-2, +2), (-2, -2), (-2, -2), (+2, -2), (-2, -2)\}$$

The Trace Back Unit (TBU) 16 determines and stores the path through the trellis, here, from the initial state $S_3$ of Frame 1 sequentially to ending state $S_1$ of Frame 11, the path being from $S_3$ to $S_2$ to $S_1$ to $S_1$ to $S_3$ to $S_4$ to $S_4$ to $S_2$ to $S_1$ to $S_3$ to $S_2$ to $S_1$, as indicated by the solid arrows in FIG. 8. Thus, as the Trace Back Unit (TBU) 16 knows the structure of the trellis and produces the output signals, here: 0, 0, 0, 1, 1, 1, 0, 0, 1, 0, 0, as indicated in FIG. 7. The Post Soft Decision (SD) Generation Unit 26 determines the soft decision (SD) for each of the produced output signals as described above for exemplary the seventh produced output signal. That is, the Post Soft Decision (SD) Generation Unit 26: assumes, at the MS+1 (where $2^{Ms}$ equals the number of trellis states Frame back from the signal being tagged with the soft decision (SD) parameter, an APM of zero; calculates, from the symbols stored in the memory 12, the Euclidian distances (D) assuming a correct signal sequence and an incorrect signal sequence; calculates the sum of the Euclidian distances (D) with the assumed incorrect signal sequence and calculates the sum of the Euclidian distances (D) with the correct signal sequence; and, calculated the soft decision (SD) for that signal by taking the difference between the calculated sums.

Figure 2:
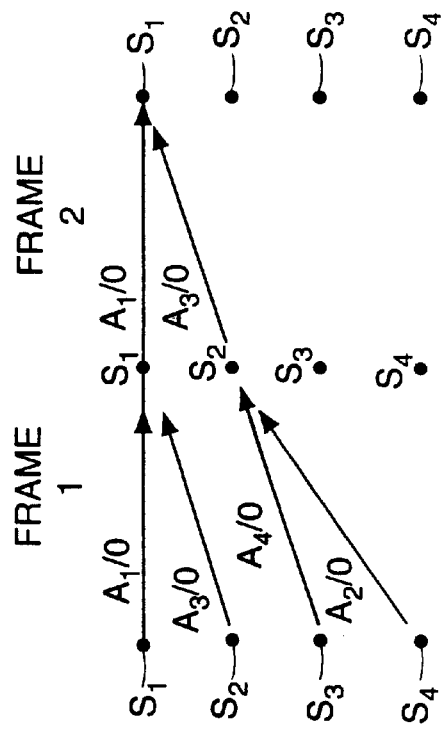
FIG. 2 is a series of two of the trellis diagrams of FIG. 1.

It is evident that, while the prior art system shown in FIG. 2 calculates a soft decision parameter for all nodes, there forty-four nodes, the system 10 (FIG. 5) calculates the soft decisions for only the signals produced by the Trace Back Unit (TBU) 16 from the symbol values which have been stored in memory 12.

Other embodiments are within the spirit and scope of the appended claims.

What is claimed is:

1. A trellis decoding system, comprising:

a memory, fed by a sequence of received signals, for storing said sequence of received signals, such signals having been encoded prior to transmission by a trellis encoder as a sequence of symbols wherein each of the symbols represents an allowed transition from an originating state to a predetermined limited number of terminating states;

a trellis decoder, fed by said sequence of received signals, for decoding the sequence of received signals; and a soft decision generator, responsive to the signals stored in the memory and to the output of the trellis decoder, for determining a soft decision parameter representative of confidence level of the trellis decoder in properly decoding the received signal into each one of the symbols and for tagging such soft decision parameter to each one of such symbols subsequent to the trellis decoder decoding the sequence of received signals into the corresponding sequence of symbols.

* * * * *